United States Patent [19]

Nagahama

[11] 4,061,987

[45] Dec. 6, 1977

[54] VOLTAGE-CONTROLLED TYPE OSCILLATOR

[75] Inventor: Yasuo Nagahama, Hamamatsu, Japan

[73] Assignee: Nippon Gakki Seizo Kabushiki Kaisha, Japan

[21] Appl. No.: 770,714

[22] Filed: Feb. 22, 1977

[30] Foreign Application Priority Data

Feb. 27, 1976 Japan ............................ 51-23236[U]

[51] Int. Cl.² ........................................ H03K 3/282
[52] U.S. Cl. .................................. 331/111; 331/177 R
[58] Field of Search ................ 331/111, 113, 177, 143

[56] References Cited
U.S. PATENT DOCUMENTS

| 3,870,971 | 3/1975 | Takahashi et al. | 331/111 |
| 3,886,485 | 5/1975 | Takahashi | 331/111 |
| 3,946,330 | 3/1976 | Takahashi | 331/111 |
| 3,959,743 | 5/1976 | Nagahama | 331/177 |

Primary Examiner—John Kominski
Attorney, Agent, or Firm—Ladas, Parry, Von Gehr, Goldsmith & Deschamps

[57] ABSTRACT

A voltage-controlled type oscillator includes a differential amplifier constituted by a first and second transistors for establishing a current, as the collector current of the second transistor, proportional to an input control voltage, and an oscillating device for producing an oscillatory signal whose frequency is determined by that current. An element having a p-n junction is connected between the second transistor and the oscillating device and a further transistor is connected between the first transistor and a power source. A portion of the current flowing from the oscillating device is divided as a base current to the abovementioned further transistor whereby an adverse influence by the base current of the second transistor is eliminated. Thus the oscillation frequency is accurately proportional to the input control voltage.

3 Claims, 3 Drawing Figures

VOLTAGE-CONTROLLED TYPE OSCILLATOR

BACKGROUND OF THE INVENTION

This invention relates to a voltage-controlled type oscillator and, more particularly, to improvements of a voltage-controlled type oscillator which controls the oscillator frequency of an oscillating section thereof by a collector current of a differential amplifier.

A voltage-controlled type oscillator for controlling the oscillating frequency of an oscillating section by a collector current of a differential amplifier is used in a circuit for oscillating an oscillatory signal of a frequency determined in response to an input control voltage and for adding a vibrato to the signal in an electronic musical instrument.

The voltage-controlled type oscillator of this conventional type includes, as shown in FIG. 1, an operational amplifier OP having a non-inverted input terminal receiving an input control voltage $F_c$ and an inverted input terminal grounded via a resistor $Rc$. A feedback circuit of the amplifier OP is formed by resistor R and R' and base-emitter paths of the pair transistors Q and Q' and these pair transistors Q and Q', constitute a differential amplifier determining a constant current of common emitters of the pair transistors in response to the input control voltage $V_c$.

In the meanwhile, a vibrato signal $Vib$ is applied, when necessary, to the input of a voltage-current converting circuit 1 and is thereupon converted to a current signal, which in turn is applied to the base of the transistor Q' of the aforementioned differential amplifier. The transistor Q' thereupon causes its collector current $i_c$ to fluctuate above and below the value determined by the input control voltage $V_c$.

The collector current $i_c$ of the transistor Q' of the differential amplifier is thus controlled by the input control voltage $V_c$ and the vibrato signal $Vib$, and the oscillating frequency of an oscillating section 2 is controlled and determined by the collector current $i_c$. Thus, the oscillating section 2 produced at an output terminal Tout, a signal having a frequency corresponding to the input control voltage $V_c$ and being added with the vibrato signal. In addition, the oscillating section 2 has a circuit for controlling an oscillating frequency in proportion to the charging and discharging time constant of a capacitor (not shown) in such a manner that the discharging current of the capacitor (not shown) becomes the collector current $i_c$ of the transistor Q' of the aforementioned differential amplifier.

In case the emitter current $i_e$ of the transistor Q' is sufficiently large and the base current $i_b$ is in a relation $i_b << i_e$ in such conventional circuit, the base current $i_b$ can be ignored and the collector current $i_c = (i_e - i_b)$ can be approximated to be equal to the emitter current $i_e$. Accordingly, this collector current $i_c$ is proportional to the input control voltage $V_c$, and the oscillating frequency of the oscillating section 2 can be controlled in proportion to the input control voltage $V_c$. However, if the emitter current $i_e$ becomes small, transistor parameter $h_{fe}$ of the transistor decreases and, accordingly the base current $i_b$ of the transistor can no longer be ignored in the relation to the emitter current $i_e$.

Therefore, the collector current $i_c$ of the transistor Q' cannot be approximated to be equal to the emitter current $i_e$ of the transistor Q'. Thus, the conventional circuit has the disadvantage that the oscillating frequency of the oscillating section 2 cannot be controlled in proportion to the input control voltage $V_c$.

SUMMARY OF THE INVENTION

The voltage-controlled type oscillator constructed according to this invention uses a principle which is entirely different from the one used in the above described prior art voltage-controlled type oscillator. According to this invention, there is provided a novel and improved voltage-controlled type oscillator which comprises substantially p-n junction semiconductive element inserted between the collector of one transistor of a differential amplifier thereof and an oscillating section, and a transistor which receives an electric current from the oscillating section at the base thereof being inserted between the collector of the other transistor of the differential amplifier and a power source. According to the above construction, the base current of the differential amplifier is cancelled with a result that the current from the oscillating section becomes proportional to the input control voltage and the oscillating section produces an oscillating frequency proportional to the input control voltage even if the emitter current of the transistor becomes small.

It is an object of this invention to provide a voltage-controlled type oscillator capable of eliminating the above described disadvantages of the conventional voltage-controlled type oscillator and capable of producing accurate oscillating frequency proportional to the input control voltage.

Other objects and features of the invention will become apparent from the description made hereinbelow with reference to the accompanying drawings.

DESCRIPTION OF THE PREFERRED EMBODIMENTS

Figure 2:
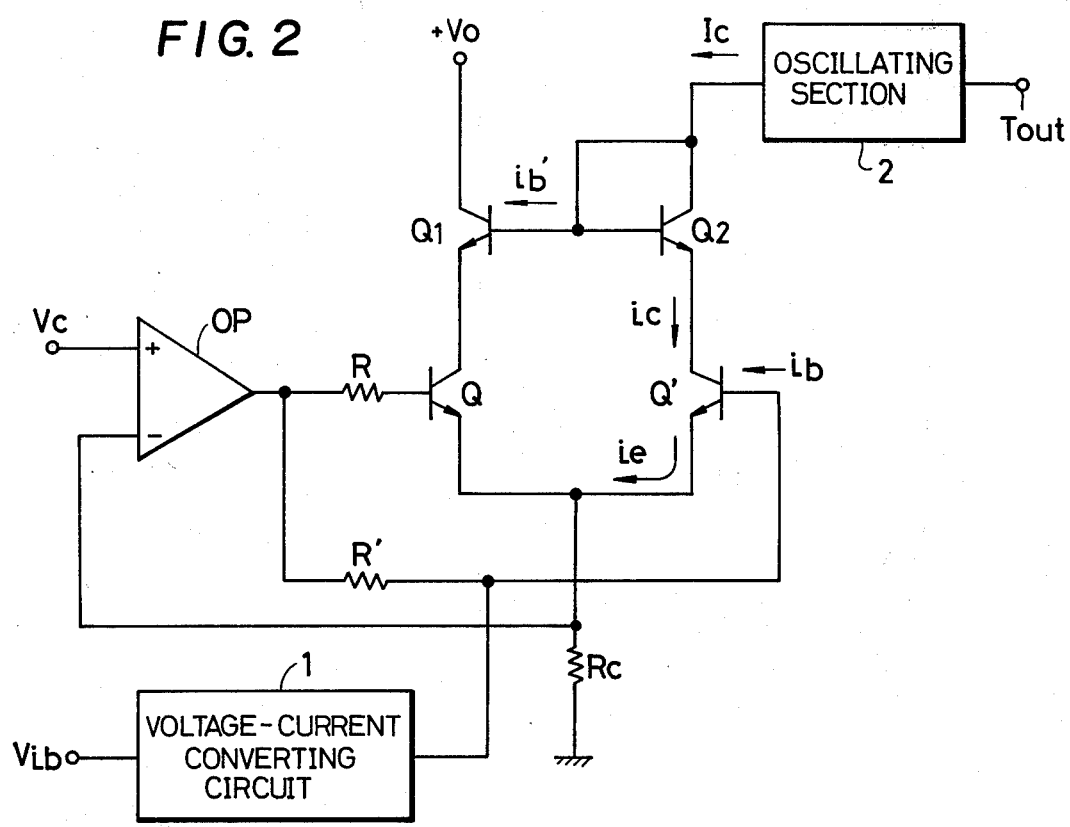
FIG. 2 is a circuit diagram showing one preferred embodiment of the voltage-controlled type oscillator constructed according to this invention.

Referring first to FIG. 2, which shows one preferred embodiment of this invention, the voltage-controlled type oscillator comprises a pair of transistor $Q_1$ and $Q_2$ connected in such a manner that the collector of the transistor $Q_1$ is connected to the power source $+Vo$, the collector of the other transistor $Q_2$ to the oscillating section 2, the emitter of the transistor $Q_1$ to the collector of the transistor Q and the emitter of the other transistor $Q_2$ to the collector of the transistor Q', and the common base of the transistors $Q_1$ and $Q_2$ to the collector of the transistor $Q_2$, respectively.

As the oscillating section 2, a device disclosed in the applicant's copending U.S. Pat. application Ser. No. 581,185 now U.S. Pat. No. 3,959,743 issued May 25, 1976 entitled "Voltage-controlled type oscillator" may, for example, be employed.

The characteristics of the transistors $Q_1$ and $Q_2$ are the same as those of the transistors Q and Q'.

Figure 1:
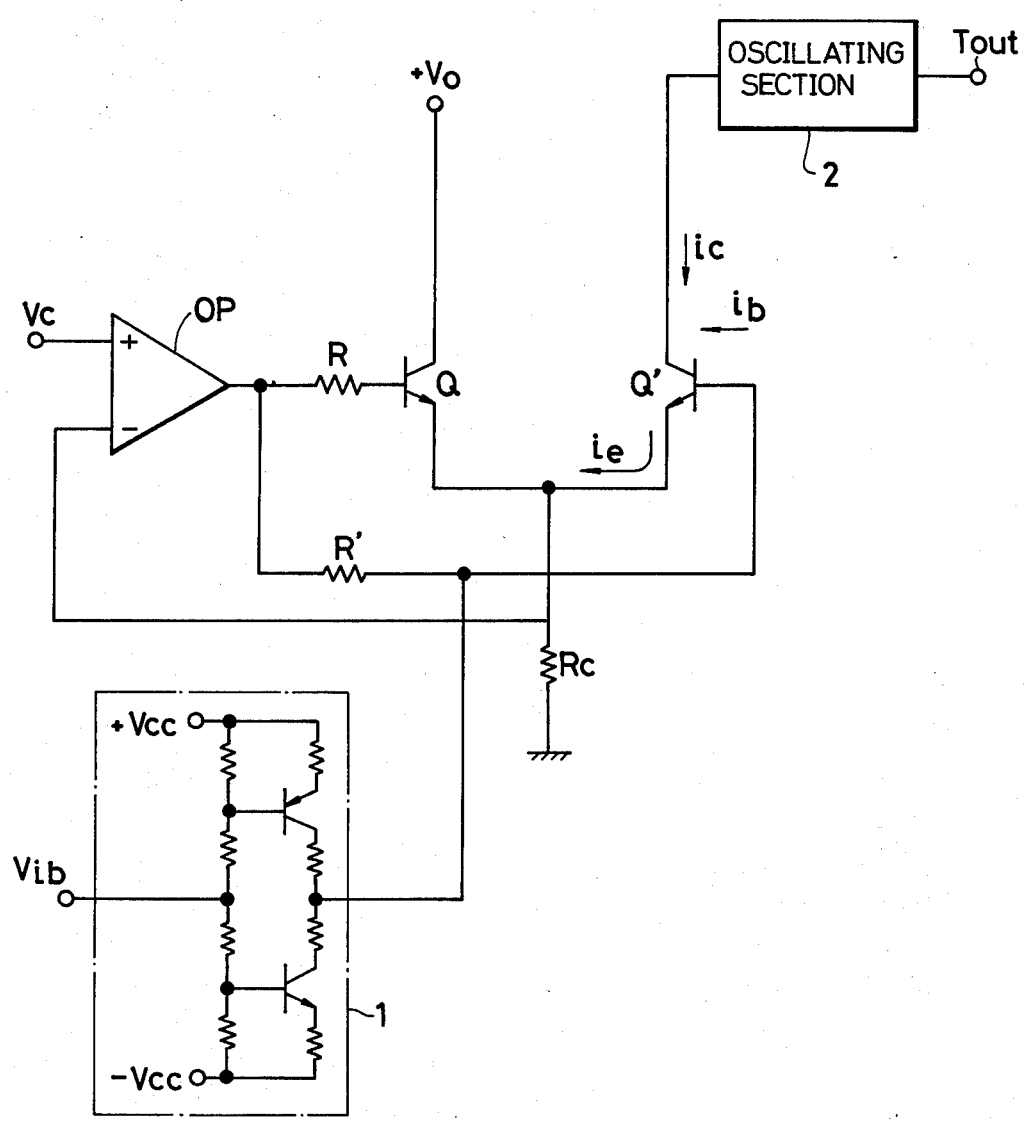
FIG. 1 is a circuit diagram showing the conventional voltage-controlled type oscillator.

In operation of the oscillator thus constructed, electric currents flowing through the bases, emitters, and collectors of the transistors Q and Q' forming a differential amplifier are the same as those of the conventional oscillator circuit shown in FIG. 1, but an electric current $I_c$ from the oscillating section 2 flowing through the collector of the transistor $Q_2$ has been reduced by an electric current $i_b'$ which constitutes the base current of the transistor $Q_1$ and, accordingly, the emitter current of the transistor $Q_2$, i.e., the collector current $i_c$ of the transistor $Q'$ becomes of a value $(I_c - i_b')$.

On the other hand, the collector current $i_c$ of the transistor $Q'$ is of a value $(i_e - i_b)$, i.e. difference between the emitter current $i_e$ of the transistor $Q'$ determined by the input control voltage $V_c$ and the base current $i_b$. Since the transistor $Q_1$ has the same characteristics as those of the transistor $Q'$ as previously described, the base current $i_b'$ of the transistor $Q_1$ is substantially the same as the base current $i_b$ of the transistor $Q'$ with the result that the collector current $I_c$ from the oscillating section 2 is substantially the same as the emitter current $i_e$ of the transistor $Q'$.

Thus, the base current $i_b$ of the differential amplifier is cancelled by the base current $i_b'$ of the transistor $Q'$, so that the current $I_c$ from the oscillating section 2 is not affected by the base current $i_b$ of the differential amplifier.

Therefore, even if the control voltage $V_c$ decreases to the vicinity of zero so that the emitter current $i_e$ of the transistor $Q'$ becomes extremely small, the base current $i_b$ need not be taken into account and the current $I_c$ from the oscillating section 2 becomes always proportional to the input control voltage $V_c$, with the result that the oscillating frequency of the section 2 can be controlled in proportion to the input control voltage $V_c$.

Figure 3:
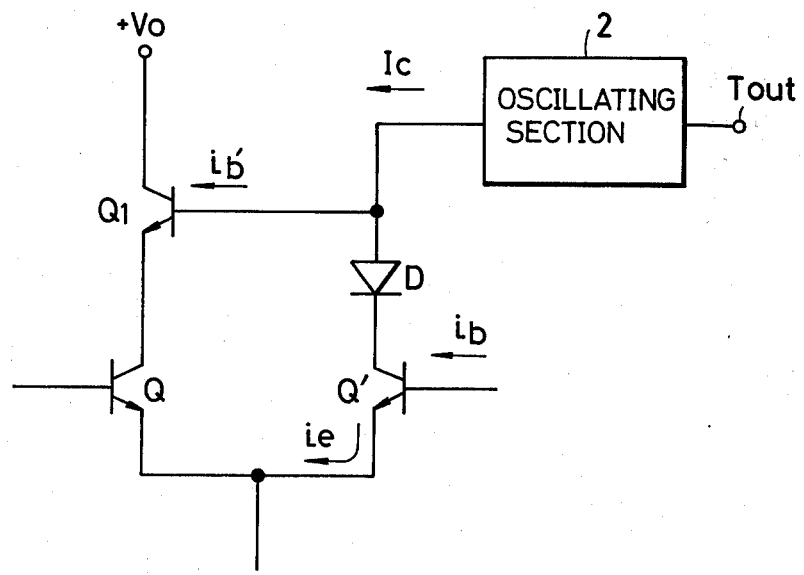
FIG. 3 is a circuit diagram showing a part of another preferred embodiment of this invention.

FIG. 3 shows another preferred embodiment of the voltage-controlled type oscillator of this invention, and only the differential amplifier section is disclosed therein.

In the embodiment shown in FIG. 2, the collector and the base of the transistor $Q_2$ are short-circuited, and according in this embodiment of FIG. 3 a diode D is employed instead of the transistor $Q_2$ so as to operate similarly to the embodiment shown in FIG. 2.

In this circuit arrangement, the characteristics of the transistor $Q_1$ are the same as those of the transistor $Q'$. Accordingly, a portion of the current $I_c$ of the oscillating section 2 of a value which is substantially the same as the base current $i_b$ of the transistor $Q'$ flows to the base of the transistor $Q_1$ as current $i_b'$. Thus, the base current $i_b$ of the transistor $Q'$ is cancelled by the base current $i_b'$ of the transistor $Q_1$. Therefore, the current $I_c$ from the oscillating section 2 becomes substantially the same as the emitter current $i_e$ of the transistor $Q'$, so that even if the transistor parameter $h_{fe}$ of the transistor decreases, the current $I_c$ is not affected by the base current $i_b$.

It should be understood from the foregoing description that the influence of the base current of the transistor need not be considered even if the input control voltage becomes small and transistor parameter $h_{fe}$ of the transistor of the differential amplifier decreases, so that an accurate oscillating frequency proportional to the input control voltage can be produced.

What is claimed is:

1. A voltage-controlled oscillator having a differential amplifier including a first and a second transistors base-biased equally by a voltage produced in response to an input control voltage, and an oscillating section connected to a collector of said second transistor for oscillating a signal having a frequency proportional to a collector current of said second transistors of said differential amplifier, comprising a $p$–$n$ junction semiconductor element connected between the collector of said second transistors of said differential amplifier and said oscillating section, and a further transistor connected between the collector of said first transistor of said differential amplifier and a power source, current from said oscillating section being applied to the base of said further transistor.

2. A voltage-controlled type oscillator as claimed in claim 1, wherein said $p$–$n$ junction semiconductor element is a transistor with its collector and base being connected together.

3. A voltage-controlled type oscillator as claimed in claim 1, wherein said $p$–$n$ junction semiconductor element is a diode.

* * * * *